United States Patent [19]

Zelenka

[11] Patent Number: 5,303,251
[45] Date of Patent: Apr. 12, 1994

[54] METHOD AND CIRCUIT ARRANGEMENT FOR DRIVING A LASER DIODE

[75] Inventor: Thomas Zelenka, Moenkeberg, Fed. Rep. of Germany

[73] Assignee: Linotype-Hell AG, Fed. Rep. of Germany

[21] Appl. No.: 977,415

[22] PCT Filed: Aug. 16, 1991

[86] PCT No.: PCT/DE91/00653

§ 371 Date: Feb. 16, 1993

§ 102(e) Date: Feb. 16, 1993

[87] PCT Pub. No.: WO92/03860

PCT Pub. Date: Mar. 5, 1992

[30] Foreign Application Priority Data

Aug. 17, 1990 [DE] Fed. Rep. of Germany ....... 4026087

[51] Int. Cl.$^5$ .............................................. H01S 3/00
[52] U.S. Cl. ............................... 372/38; 312/29; 312/31
[58] Field of Search ............................. 372/38, 29, 31

[56] References Cited

U.S. PATENT DOCUMENTS

| | | | |
|---|---|---|---|
| 4,488,305 | 12/1984 | Claverie et al. | 372/38 |
| 4,674,093 | 6/1987 | Angerstein et al. | 372/38 |
| 4,733,398 | 3/1988 | Shibagaki et al. | 372/31 |
| 4,754,460 | 6/1988 | Kimura et al. | 372/38 |
| 4,766,597 | 8/1988 | Olshansky | 372/44 |
| 4,835,780 | 5/1989 | Sugimura et al. | 372/29 |
| 4,884,280 | 11/1989 | Kinoshita | 372/38 |
| 4,888,777 | 12/1989 | Takeyama | 372/38 |

FOREIGN PATENT DOCUMENTS

| | | |
|---|---|---|
| 0134960 | 3/1985 | European Pat. Off. ....... H01S 3/13 |
| 0319852A1 | 6/1989 | European Pat. Off. ...... H01S 3/103 |
| 3404444A1 | 8/1984 | Fed. Rep. of Germany ... H01S 3/13 |
| 3601300A1 | 7/1986 | Fed. Rep. of Germany .......... H01S 3/133 |
| 3614411A1 | 12/1986 | Fed. Rep. of Germany .......... G11B 7/135 |
| 3534744 | 4/1987 | Fed. Rep. of Germany .......... H01S 3/133 |
| 2653554C2 | 3/1988 | Fed. Rep. of Germany .......... H01S 3/103 |
| 2180985A | 4/1987 | United Kingdom ......... H01S 3/103 |
| 2229268A | 9/1990 | United Kingdom ......... G11B 7/125 |

OTHER PUBLICATIONS

Patent Abstracts of Japan, vol. 14, No. 239, May 21, 1990, "Drive Circuit of Semiconductor Laser", Chitaka Konishi.
Patent Abstracts of Japan, vol. 13, No. 184, Apr. 28, 1989, "Drive Circuit of Semiconductor Laser", Nobuyuki Hirakata.

*Primary Examiner*—Georgia Y. Epps
*Attorney, Agent, or Firm*—Hill, Steadman & Simpson

[57] ABSTRACT

The invention relates to a process and circuitry for controlling a laser diode. To compensate for the temperature-dependent drop in the light intensity produced by the laser diode, the laser diode is controlled by a voltage generator with an adjustable internal resistance. A rise in the driver current of the laser diode as the temperature rises is set by the adjustable internal resistance in such a way that the rise in the light intensity produced determined by the rise in the driver current compensates for the temperature-dependent fall in the light intensity.

4 Claims, 2 Drawing Sheets

METHOD AND CIRCUIT ARRANGEMENT FOR DRIVING A LASER DIODE

BACKGROUND OF THE INVENTION

The invention refers to the fields of technology herein laser diodes are utilized, for example to reproduction technology, and is directed to a method and to a circuit arrangement for driving a laser diode in a recording device such as a laser printer or laser recorder.

In such a recording device, the light output by the laser diode and modulated with the information to be recorded is shaped into a recording beam with optical means and is deflected point-by-point and line-byline across a recording medium with a deflection system during recording.

In most cases, a constant current source is employed for driving the laser diode. The constant current source generates a constant driver current that is modulated by an image signal that contains the information to be recorded and is supplied to the laser diode.

The laser diode works in switched mode fashion for recording line information, wherein the driver current modulated by a two-level image signal switches the laser diode on and off.

In order to achieve a high recording quality in the recording of line information, the laser diode must switch quickly and the light level output by the laser diode must be constant in the on-time intervals in order to achieve a uniform illumination.

Based on its very nature, the laser diode does not satisfy the demand for a constant light level in the on-time intervals.

The output light power is temperature dependent, namely such that the light power decreases with rising operating temperature of the laser diode.

The gradual rise in the operating temperature in the substrate of the laser diode and the drop of the output light power caused as a result thereof can in fact be compensated by regulating the housing temperature; in a modulation or, switched mode, however, the laser diode still has a dynamic temperature effect. The cause of the dynamic temperature affect is the temperature change of the laser transition in the chip dependent on the modulation or, on the image signal that controls the modulation. Due to this temperature dependency of the laser transition, a temperature difference between substrate and laser transition continues to exist even when the housing temperature is regulated and an internal temperature compensation process is the consequence. Given a laser diode working in switched mode, this inner temperature compensation process leads to a variation of the output light power dependent on the image signal in such a way that the output light power rises above the nominal level in the respective turn-on time and then only gradually reaches the nominal level within the individual on-time intervals. Due to this effect, a disturbing lag effect that has a considerable influence on the recording quality arises on the recording medium when recording line information.

Various measures for correcting the light power output of a laser diode are already known.

For example, it has already been proposed to measure the light power output by the laser diode within the respective time interval required for the recording of a line and to control the light power via the driver current dependent on the measured result.

GB Patent 21 01 851 likewise already discloses that the output light power be measured with a photodiode (monitor diode) integrated in the laser diode within or outside the time interval required for the recording of a line, to calculate correction values from the respectively measured light power, to intermediately store the correction values line-byline in sample-and-hold circuits, and to control the light power via the driver current dependent on the stored correction values.

A regulation for correcting the light power output has the disadvantage that it is involved and that stability problems arise due to the control loops, and the switching speed of the laser diodes is reduced.

It is therefore an object of the invention to specify a method and a circuit arrangement for driving a laser diode with which a simple correction of the output light power and an improved switching behavior are achieved.

According to the method of the invention for driving a laser diode, the laser diode is charged by a driver current which defines an output light power, the output light power being dependent upon and dropping with a rise of internal temperature of the laser diode. For compensating the temperature-dependent drop in light power, the laser diode is driven by a voltage generator having a variable internal resistance $R_i$. The internal resistance is calculated according to the equation:

$$R_i = \sigma \frac{T_{KU}}{T_{KP}} - R_{Di}$$

wherein $\sigma$ is the efficiency of the laser diode, $T_{KU}$ is a temperature coefficient based on an on-state voltage of the laser diode, $T_{kp}$ is a temperature coefficient based on a power of the laser diode, and $R_{Di}$ is an internal resistance of the laser diode, a rise of the driver current given rising temperature of the laser diode being limited by the internal resistance $R_i$ such that a rise in the output light power caused by a rise of the driver current compensates the temperature-dependent drop in light power.

As a result of these techniques, it is particularly a correction of the disturbing lag effect that can be achieved given employment of the laser diodes in recording devices without deteriorating the switching speed and a good recording quality given high recording speed can be achieved overall.

The invention shall be set forth in greater detail below with reference to FIGS. 1 through 3.

DESCRIPTION OF THE PREFERRED EMBODIMENTS

Figure 1:
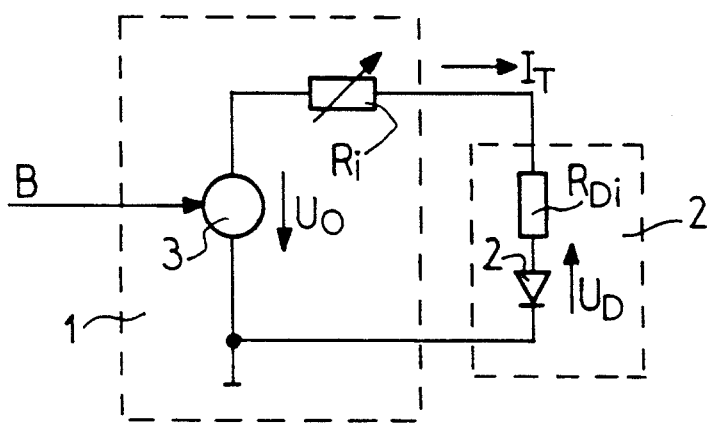
FIG. 1 is a fundamental exemplary embodiment of a circuit arrange a laser diode.

FIG. 1 shows a fundamental exemplary embodiment a circuit arrangement for driving a laser diode. The circuit arrangement 1 for driving a laser diode 2 is essentially composed of a voltage source 3 having a variable internal resistance $R_i$. In switched mode, the voltage source 3 is controlled by a two-level image signal B which modulates the generator voltage $U_O$ of the voltage source 3 dependent on the information to be recorded. During continuous mode operation, the voltage source 3 outputs a constant generator voltage $U_O$.

The real laser diode 2 is represented in the equivalent circuit diagram as a series circuit composed of an ideal laser diode 2' and of the internal resistance $R_{Di}$ of the real laser diode. The generator voltage $U_O$ generates a driver current $I_T$ for the laser diode 2, this driver current $I_T$ being dependent on the generator voltage $U_O$, on the on-state voltage $U_D$ of the laser diode 2' and the internal resistances $R_1$ and $R_{01}$ according to equation (1).

$$I_T = \frac{U_O - U_D}{R_i + R_{Di}} \quad (1)$$

The light power P output by the laser diode 2 is proportional to the driver current $I_T$. A variation of the driver current $\Delta T_T$ leads to a variation of the output light power $\Delta P$ according to equation 2.

$$\Delta P_i = \frac{dP}{di} \Delta I_T = \sigma \Delta I_T \quad (2)$$

In equation (2), "$\sigma$" is the efficiency of the laser diode 2 that, for example, amounts to 0.3 through 1 mW/mA.

Due to the temperature behavior of the laser diode 2 set forth in the introduction to the specification, the output light power P and the on-state voltage $U_D$ of the laser diode 2 drop with rising temperature T.

A temperature change $\Delta T$ leads to a modification of the output light power $\Delta P_U$ according to equation (3).

$$\Delta P_U = \frac{dP_U}{dT} \Delta T = T_{KP} \Delta T \quad (3)$$

In equation (3), $T_{KP} = dP/dT$ is the temperature coefficient referred to the power which and for example, can be $-0.4$ through $-0.7$ mw/°C.

A temperature-dependent change in the on-state voltage $U_D$ of the laser diode 2 leads to a rise in the driver current $I_T$ due to the inventive drive of the laser diode 1 with a voltage source 3 according to equation (1). By varying the on-state voltage $\Delta U_D$ given a temperature change $\Delta T$, a variation of the driver current $\Delta T_i$ derives according to equation (4).

$$\Delta I_T = \frac{-dU_P}{dT} \cdot \frac{\Delta T}{R_i + R_{Di}} = -T_{KU} \frac{\Delta T}{R_i + R_{Di}} \quad (4)$$

In equation (5), $T_{KU} = dU_D/dT$ is the temperature coefficient referred to the voltage which, for example, is $-1.7$ through $-1.3$ mW/°C.

Due to the type of drive for the laser diode, the rise in the driver current IT due to the temperature-dependent decrease in the on-state voltage UD can be set such according to the idea of the invention with the variable internal resistance $R_1$ such that the temperature-dependent drop of the light power P is corrected, whereby a constant nominal level is advantageously achieved in continuous mode operation and in the on-time intervals of switched mode.

A compensation of the temperature-dependent drop in light power is achieved when $\Delta P_1 = -\Delta P_U$ applies. With equation (4), the internal resistance $R_1$ required for the compensation can be calculated therefrom according to equation (5) as follows:

$$R_i = \sigma \frac{T_{KU}}{T_{KP}} - R_{Di} \quad (5)$$

In practice, the calculated internal resistance R, can be positive or negative, so that the drive of the laser diode 2 must occur with a voltage source having positive or having negative internal resistance. Exemplary embodiments of a voltage source having positive and negative internal resistance are shown and described in FIG. 3.

Figure 2A:
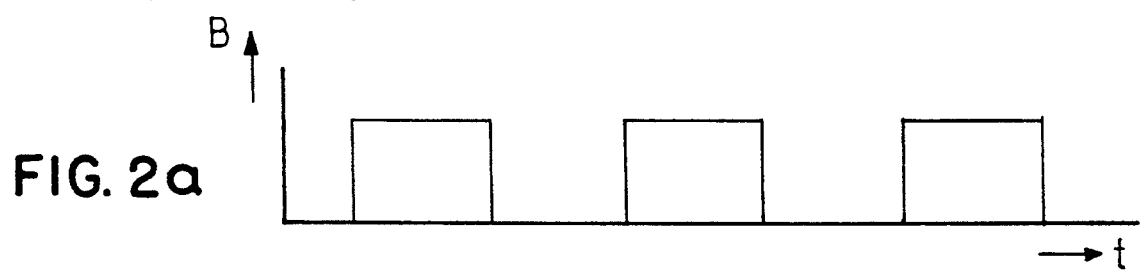
FIGS. 2a to 2f are a time diagram.
Figure 2B:
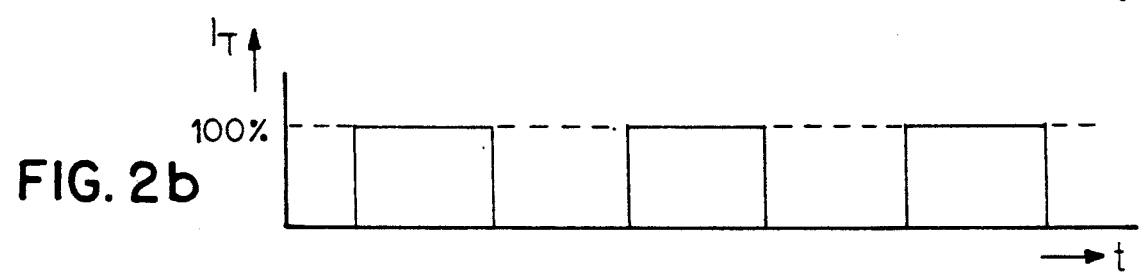
Figure 2C:
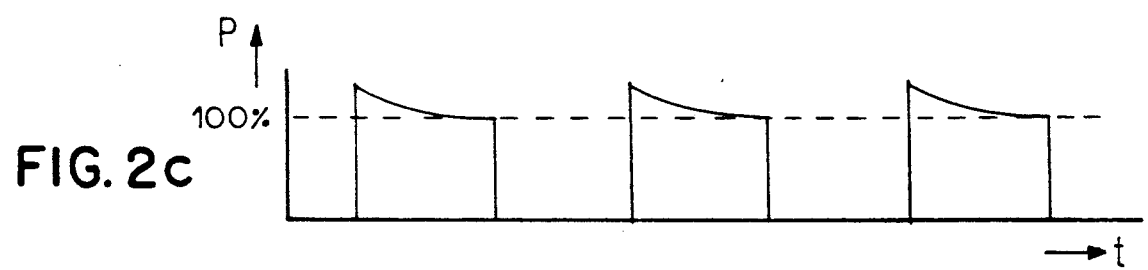
Figure 2D:
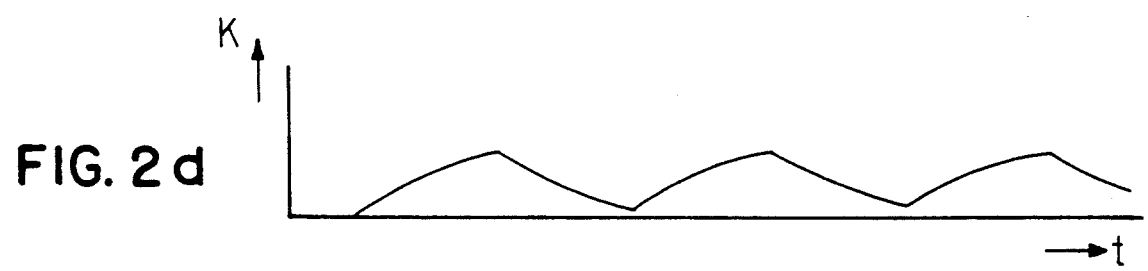
Figure 2E:
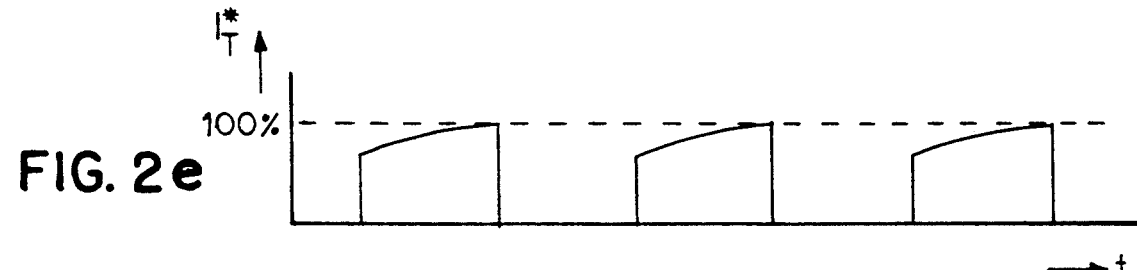
Figure 2F:
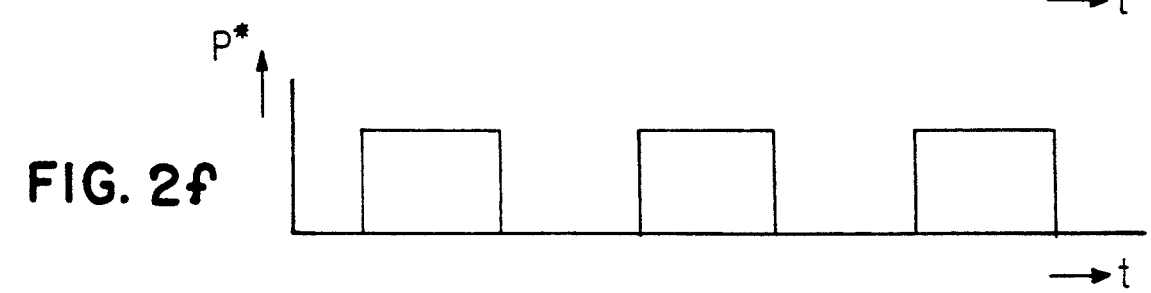

In diagrams FIGS. 2a), 2b), and 2c) for the switched mode, the chronological curves of the image signal B (diagram 2a), of the driver current $I_T$ (diagram 26 and the light power P output by the laser diode 2 (diagram 2c) are shown on the basis of the temperature compensation process at the laser transition set forth in the introduction to the specification given traditional drive of the laser diode. Diagram 2c) shows that the output light power P respectively rises above the nominal power level (100%) at the turn-on time and only gradually reaches the nominal power level within the respective on-time intervals, as a result whereof the disturbing lag effect already likewise mentioned in the introduction to the specification arises on the recording medium.

The result achieved by the inventive drive of the laser diode 2 is shown in diagram 2e) and 2f).

Diagram 2d shows the driver current $I^*_T$ that occurs 2f voltage drive of the laser diode and diagram 2f shows the chronological curve of the corrected light power P*.

Figure 3A:
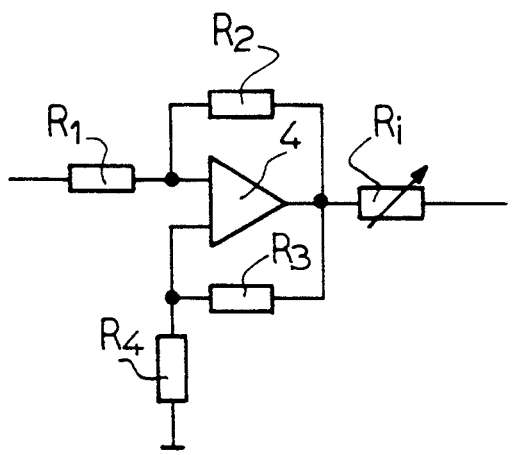
FIGS. 3a–3b are exemplary embodiments of voltage generators having positive and negative internal resistance.

FIG. 3a shows an exemplary embodiment of a voltage source having a variable, positive internal resistance $R_i$ that is composed of a wired operational amplifier 4.

Figure 3B:
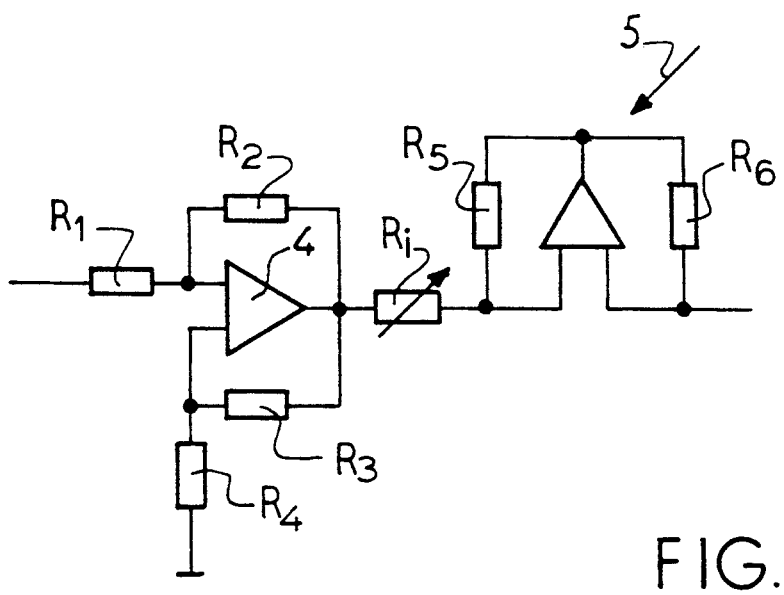

FIG. 3b shows an exemplary embodiment of a voltage source having a variable, negative internal resistance $R_i$ that differs from the exemplary embodiment shown in FIG. 3a in that the voltage source shown in FIG. 3b is followed by a circuit 5 that simulates a negative internal resistance.

Although various minor changes and modifications might be proposed by those skilled in the art, it will be understood that I wish to include within the claims of the patent warranted hereon all such changes and modifications as reasonably come within my contribution to the art.

I claim:

1. A method for driving a laser diode, comprising the steps of:

driving the laser diode with a driver current that defines an output light power, the output light power dropping in dependence upon a rise of internal temperature of the laser diode;

compensating the temperature-dependent drop in light power by driving the laser diode with a voltage generator having a variable internal resistance $R_i$, a rise of the driver current given rising internal temperature of the laser diode being limited by the internal resistance $R_i$ such that a rise in the output light power caused by a rise of the driver current compensates said temperature-dependent drop in light power; and calculating the internal resistance $R_i$ according to the equation:

$$R_i = \sigma \frac{T_{KU}}{T_{KP}} - R_{Di}$$

wherein $\rho$ is an efficiency of the laser diode, $T_{Ku}$ is a temperature coefficient with reference to an on-state voltage of the laser diode, $T_{Kp}$ is a temperature coefficient relating to a power of the laser diode, and $R_{Di}$ is an internal resistance of the laser diode.

2. A method for driving a laser diode, comprising the steps of:
   driving the laser diode with a driver current that defines an output light power, the output light power dropping and being dependent upon a rise of temperature of the laser diode;
   compensating the temperature-dependent drop in light power by driving the laser diode with a voltage generator having an internal resistance $R_i$; and
   calculating the internal resistance $R_i$ according to the equation $$R_i = \sigma \frac{T_{KU}}{T_{KP}} - R_{Di}$$

wherein $\rho$ is an efficiency of the laser diode, $T_{Ku}$ is a temperature coefficient with reference to an on-state voltage of the laser diode, $T_{Kp}$ is a temperature coefficient relating to a power of the laser diode, and $R_{Di}$ is an internal resistance 2f the laser diode.

3. A circuit arrangement for driving a laser diode, comprising:
   generator means for generating a driver current for defining an output light power of the laser diode, the output light power of the laser diode being dependent upon and dropping with a rise in internal temperature thereof;
   means for compensation of the temperature-dependent drop of the light power, said means comprising a voltage generator having a voltage source and a variable internal resistance Ri; and
   the internal resistance Ri of said voltage generator being calculated according to an equation:

$$R_i = \sigma \frac{T_{KU}}{T_{KP}} - R_{Di}$$

where $\rho$ is an efficiency of the laser diode, $T_{Ku}$ is a temperature coefficient based on an on-state voltage of the laser diode, $T_{KE}$ is a temperature coefficient based on a power of the laser diode, and $R_{Di}$ is an internal resistance of the laser diode.

4. A circuit arrangement for driving a laser diode, comprising:
   generator means for generating a driver current for defining an output light power of the laser diode, the output light power of the laser diode being dependent upon and dropping with a rise of temperature thereof;
   means for compensation of the temperature-dependent drop of the light power, said means comprising a voltage generator having a voltage source and an internal resistance $R_i$, and
   the internal resistance $R_i$ of said voltage generator being calculated according to an equation:

$$R_i = \sigma \frac{T_{KU}}{T_{KP}} - R_{Di}$$

where Y is an efficiency of the laser diode, $T_{KU}$ is a temperature coefficient based on an on-state voltage of the laser diode, $T_{Kp}$ is a temperature coefficient based on a power of the laser diode, and $R_{DI}$ is an internal resistance of the laser diode.

* * * * *